(12) United States Patent
Mori

(10) Patent No.: US 10,622,989 B2
(45) Date of Patent: Apr. 14, 2020

(54) INSULATED-GATE SEMICONDUCTOR DEVICE DRIVING CIRCUIT

(71) Applicant: FUJI ELECTRIC CO., LTD., Kawasaki-shi, Kanagawa (JP)

(72) Inventor: Takahiro Mori, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/260,092

(22) Filed: Jan. 28, 2019

(65) Prior Publication Data

US 2019/0173463 A1 Jun. 6, 2019

Related U.S. Application Data

(63) Continuation of application No. PCT/JP2017/046341, filed on Dec. 25, 2017.

(30) Foreign Application Priority Data

Feb. 17, 2017 (JP) .................................. 2017-027657

(51) Int. Cl.
*H03K 17/12* (2006.01)
*H03K 17/14* (2006.01)
(Continued)

(52) U.S. Cl.
CPC ......... *H03K 17/145* (2013.01); *H01L 27/088* (2013.01); *H03K 17/161* (2013.01)

(58) Field of Classification Search
CPC ... H03K 17/145; H03K 17/161; H01L 27/088
See application file for complete search history.

(56) References Cited

U.S. PATENT DOCUMENTS 8,970,259 B2* 3/2015 Mori .................... H03K 17/145
327/108
9,356,580 B2* 5/2016 Mori ..................... H02M 1/088
(Continued)

FOREIGN PATENT DOCUMENTS

| EP | 1 995 862 A1 | 11/2008 |
|---|---|---|
| JP | H08-340245 A | 12/1996 |

(Continued)

*Primary Examiner* — Kenneth B Wells
(74) *Attorney, Agent, or Firm* — Rabin & Berdo, P.C.

(57) ABSTRACT

A driving circuit that drives an insulated-gate semiconductor device. The driving circuit includes a constant-current generation circuit and a discharge circuit. The constant-current generation circuit has first and second transistors forming a current mirror, and a constant-current circuit connected to the drain of the first transistor for providing a constant current to the current mirror. The discharge circuit is connected to a gate of the insulated-gate semiconductor device and the drain of the second transistor, and includes a third transistor. The discharge circuit is configured to draw out a current injected into the gate of the insulated-gate semiconductor device by inputting a driving signal to the gate of the third transistor, and correct a metal-oxide-semiconductor (MOS) size of the third transistor so as to adjust an amount of a current that flows via the drain and the source of the third transistor to ground.

18 Claims, 11 Drawing Sheets

(51) Int. Cl.
*H03K 17/16* (2006.01)
*H03K 17/687* (2006.01)
*H01L 27/088* (2006.01)

(56) References Cited

U.S. PATENT DOCUMENTS

| | | | |
|---|---|---|---|
| 9,590,612 B2 * | 3/2017 | Mori | ............... H01L 21/822 |
| 2013/0285732 A1 | 10/2013 | Mori | |
| 2016/0006429 A1 * | 1/2016 | Mori | ............... H02M 1/088 |
| | | | 323/312 |
| 2016/0301406 A1 * | 10/2016 | Mori | ............... H01L 21/822 |

FOREIGN PATENT DOCUMENTS

| | | |
|---|---|---|
| JP | 2005-027429 A | 1/2005 |
| JP | 2007-252098 A | 9/2007 |
| JP | 2008-178248 A | 7/2008 |
| JP | 2013-098243 A | 5/2013 |
| JP | 2013-219633 A | 10/2013 |
| JP | 2016-052197 A | 4/2016 |
| WO | WO-2016/009582 A1 | 1/2016 |

* cited by examiner

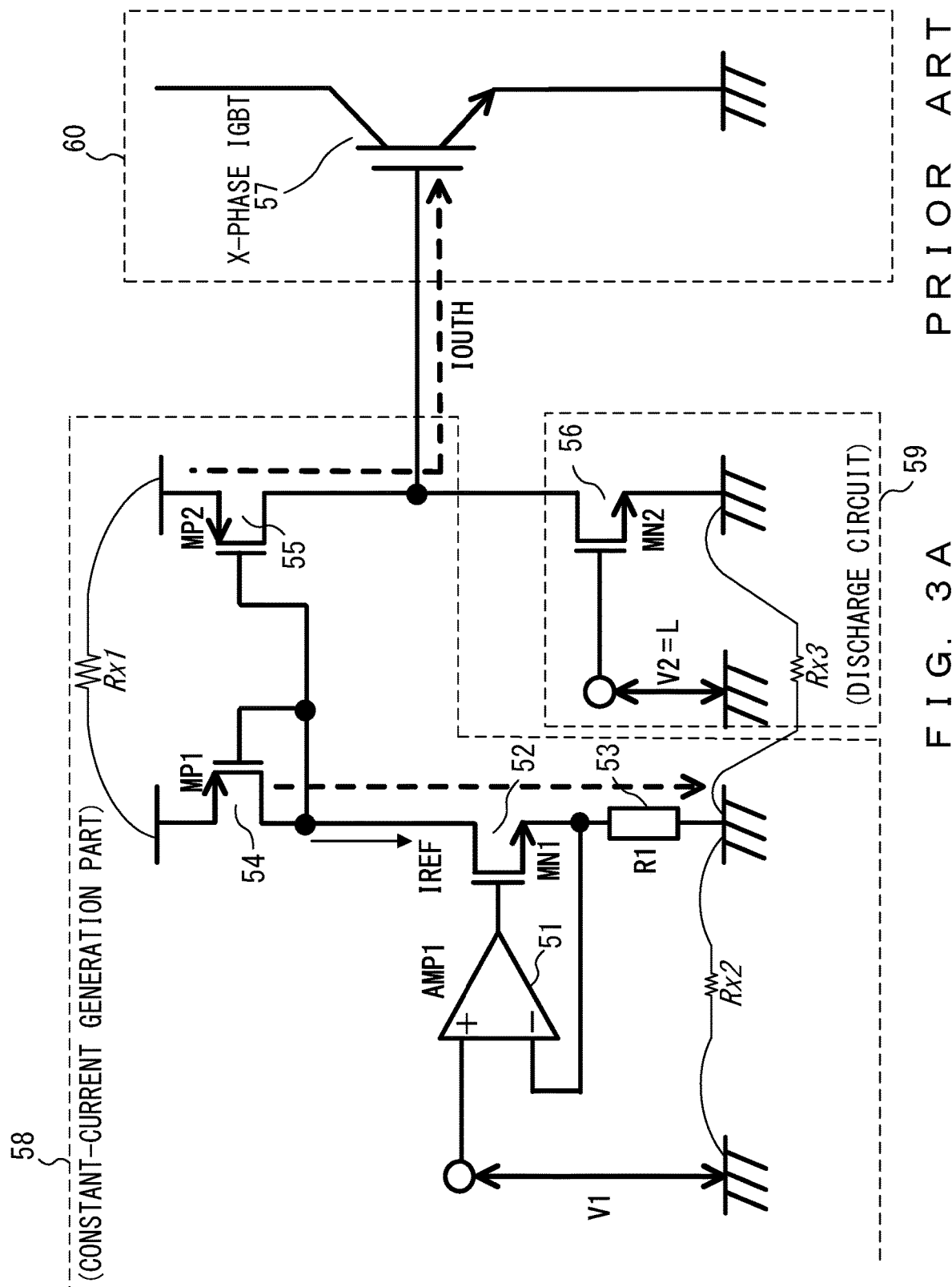

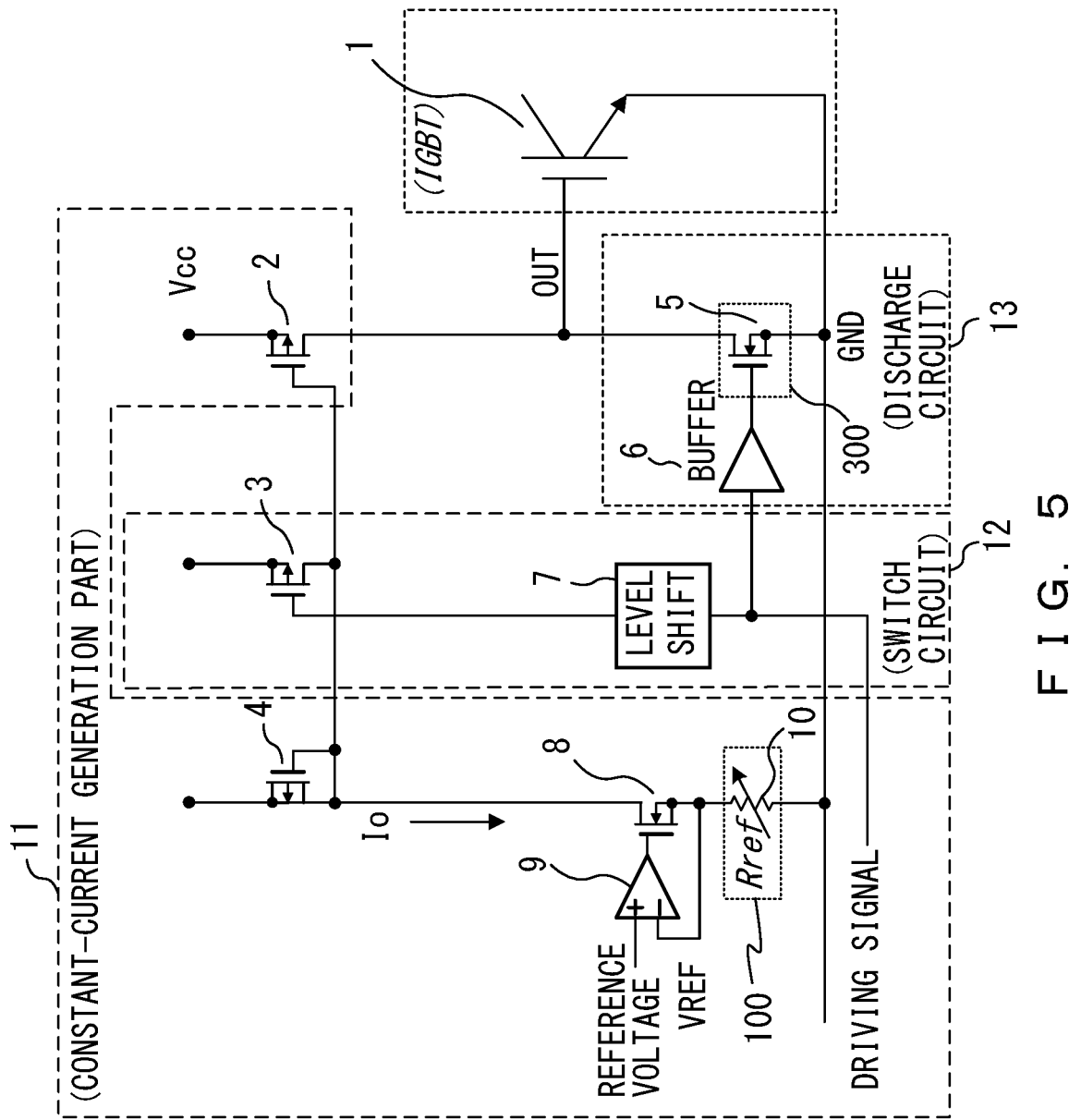
F I G. 5

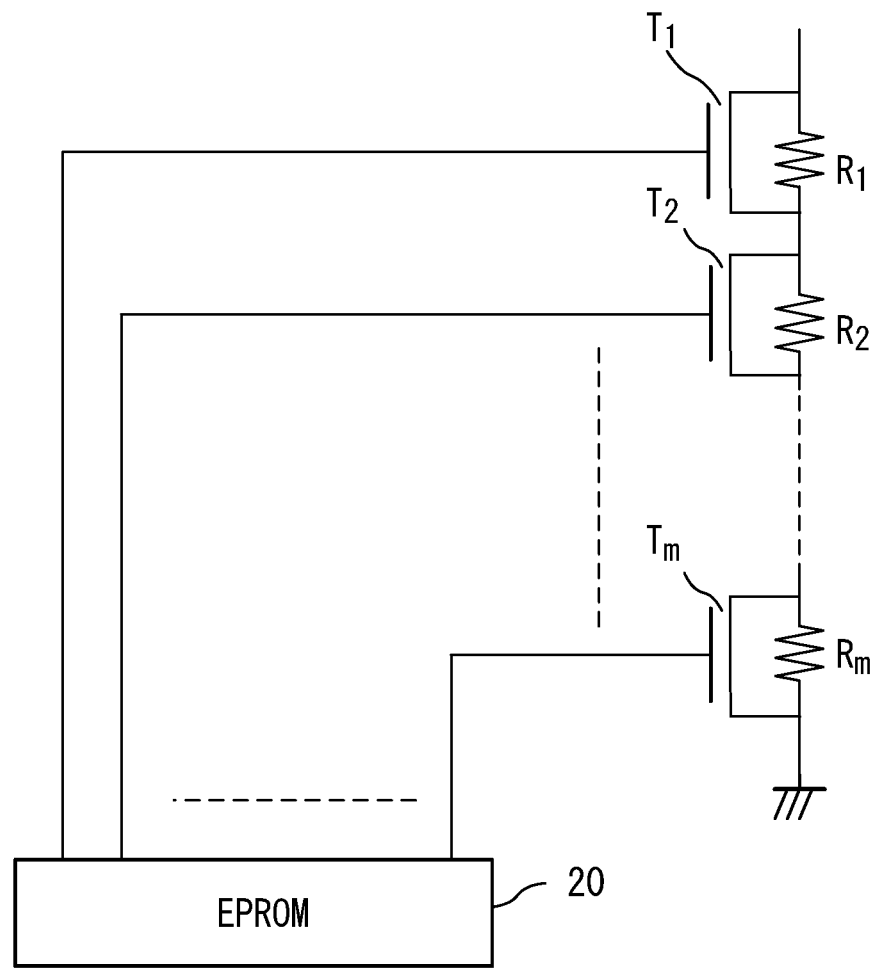
F I G. 6

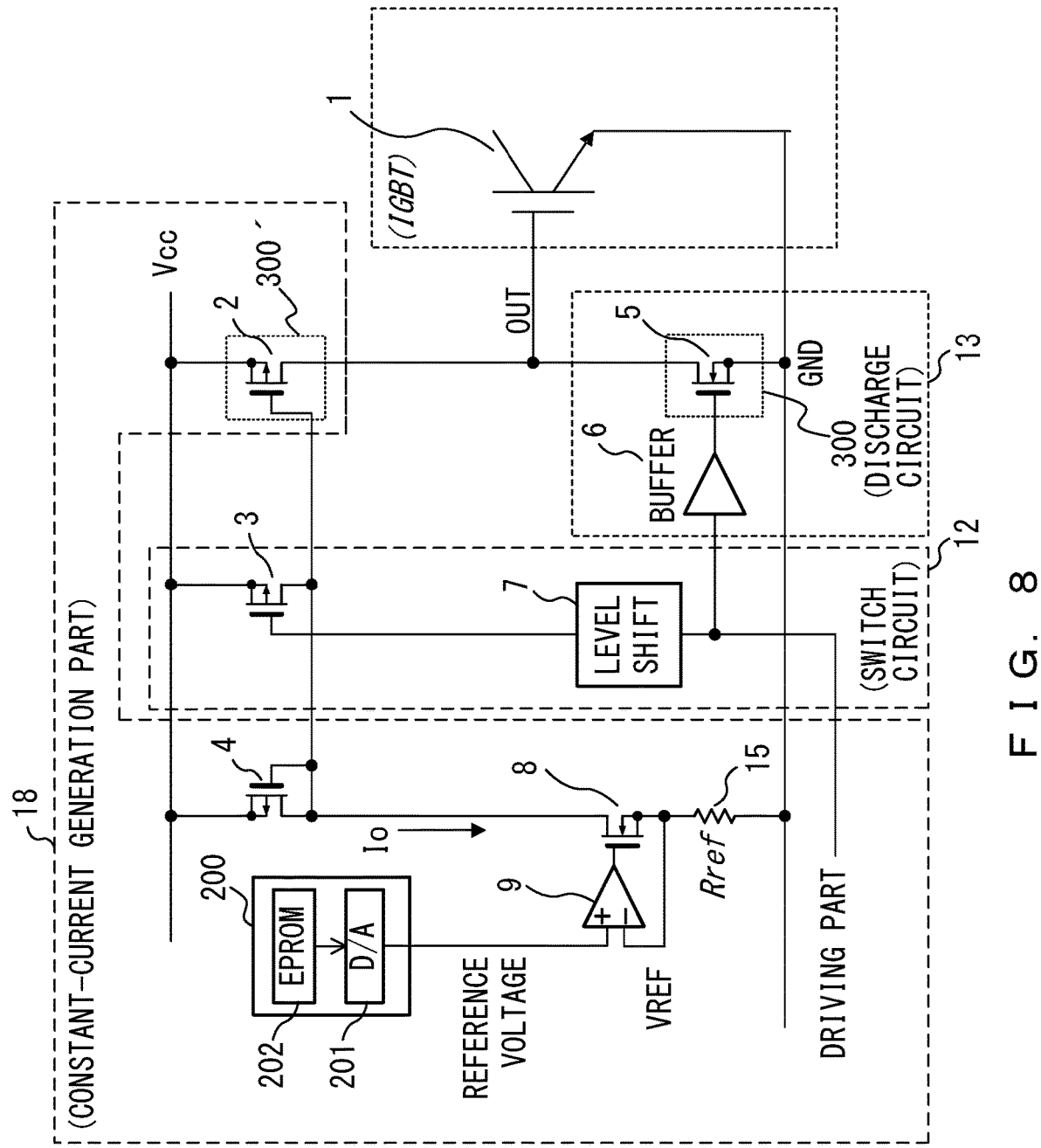
F I G. 8

US 10,622,989 B2

INSULATED-GATE SEMICONDUCTOR DEVICE DRIVING CIRCUIT

CROSS-REFERENCE TO RELATED APPLICATION

This application is a continuation application of International Application PCT/JP2017/046341 filed on Dec. 25, 2017 and designated the U.S., the entire contents of which are incorporated herein by reference.

BACKGROUND OF THE INVENTION

Field

FIG. 1 illustrates the chip layout of a conventional integrated circuit (IC) integrated with an insulated-gate semiconductor device driving circuit for driving individual insulated-gate semiconductor devices (e.g., insulated gate bipolar transistors (IGBTs)) that correspond to an X phase, a Y phase, and a Z phase. In FIG. 1, the output pads of the X, Y, and Z phases are indicated in a lower stage as output pads, and the pads of a PGND (power ground) and a VCC (power-supply voltage) are indicated in an upper stage as input pads.

In the configuration depicted in FIG. 1, the pad size of the IC cannot be decreased, and the chip area cannot be increased. Hence, only one pad that can serve as an input can be provided for each of the VCC (power-supply voltage) and the PGND (power ground).

Accordingly, in the chip layout configuration, for example, individual ground lines extending from the X, Y, and Z phases to the PGND (power ground) pad may each have a different wire length, thereby leading to a problem of a difference (variation) in output current that is considered to be mainly caused by wire resistances of the input and output of each phase (this is because, for example, aluminum or copper is typically used for wires within an IC).

In the chip layout depicted in FIG. 1, in addition, individual driving parts for the three phases do not have the same layout configuration. Hence, the layout configurations of the individual driving parts for the three phases each have a different length of ground line and power supply line connected to the PGND (power ground) pad.

FIG. 2 represents the respective lengths of ground lines extending from one PGND associated with the layout configuration of the driving parts for the three phases depicted in FIG. 1 to individual output pads of the three phases (OUTX, OUTY, OUTZ).

Accordingly, the length of a ground line extending along a common wire from one PGND pad depicted in FIG. 2 (e.g., wire B) and via a source of a low-side NMOS transistor (N-type metal-oxide-semiconductor field effect transistor) of a driving part, then passing via a wire extending from a drain of the low-side NMOS transistor to a wire connected to an output pad (e.g., wire A), and finally reaching an output pad (OUTX, OUTY, OUTZ) is different for each of the three phases. Hence, the resistances based on the individual wire lengths (wire resistances) are different from each other.

In the example depicted in FIG. 2, the resistances of the individual wires extending from the PGND to the output pads of the corresponding phases approximately satisfy a relationship of "x-phase wire resistance<Y-phase wire resistance<Z-phase wire resistance". Thus, the Z-phase wire resistance is the highest, the Y-phase wire resistance is the second highest, and the X-phase wire resistance is the lowest.

Accordingly, there has been a problem that even when driving parts for three phases are similarly designed, the characteristics of the output currents of the three phases cannot be made identical with each other (cannot be equalized), as indicated in FIG. 4.

FIG. 3A illustrates how a conventional driving part for each of three phases (X phase is indicated as an example) charges a gate of an insulated-gate semiconductor device by using a high-side PMOS transistor (P-channel metal-oxide-semiconductor field effect transistor). FIG. 3B illustrates how the driving part depicted in FIG. 3A charges a gate of an insulated-gate semiconductor device with electrical charges by using a low-side NMOS transistor (N-channel MOS field effect transistor).

Descriptions will be given of the configuration of a driving part (output driver) of a conventional driving circuit by referring to FIGS. 3A and 3B. As depicted in FIGS. 3A and 3B, the conventional driving part includes a constant-current generation circuit 58 that includes two PMOS transistors 54 and 55 forming a current mirror configuration to drive an X-phase IGBT circuit 60 with a constant current, wherein the constant-current generation circuit 58 drives an IGBT 57 by injecting a constant current from a drain of the PMOS transistor 55 forming an output part of the current mirror into a gate of the IGBT.

The two PMOS transistors (MP1, MP2) 54 and 55 within the constant-current generation circuit 58 form a current mirror. Sources of the MP1 (54) and MP2 (55) forming a current mirror are connected to a power-supply line connected to a power-supply voltage Vcc (not illustrated), and a drain of the MP1 (54) forming an input part of the current mirror is connected to a drain of an NMOS transistor (MN1) 52.

The gates of the MP1 (54) and MP2 (55) are also connected to the drain of the MP1 (54).

A gate of the NMOS transistor MN1 (52) is connected to an output of an operational amplifier (AMP1) 51. A predetermined referential voltage V1 is input to a non-inverting input of the AMP1 (51). An inverting input of the AMP1 (52) is connected a source of the MN1 (52).

The source of the MN1 (52) is connected to one end of a resistor R1 (53), and another end of the resistor R1 (53) is connected to a ground line (GND) connected to a PGND pad.

In the configuration described above, when a predetermined constant current flows through the input part of the current mirror while a voltage input to a gate of an NMOS transistor (MN2) 56 provided at a discharge circuit 59 is at low level L, a current (IOUTH) proportional to a current flowing through the input part is injected, owing to a current mirror effect, from the drain of the MP2 (55) on a secondary side into the gate of the X-phase IGBT 57, thereby charging the gate of the X-phase IGBT 57, and the gate voltage exceeds a threshold, with the result that the X-phase IGBT 57 is turned on. It should be noted that the value of a current that flows through the input part of the current mirror is adjusted by appropriately selecting a value for the resistor R1 (53) connected to the source of the MN1 (52).

In FIG. 3B, when a voltage input to the gate of the MN2 (56), i.e., an N-channel MOS field effect transistor provided on a low side, is at high level H, the NM2 (56) within the discharge circuit 59 is brought into conduction, and a discharging current (IOUTL) flows in a direction opposite to a direction in which a charging current for driving the IGBT depicted in FIG. 3A flows. The discharging current is larger than the charging current, and hence electric charges are drawn from the gate of the IGBT 57 to the ground (GND).

The descriptions above are directed mainly to operations of the X-phase IGBT circuit 60. Similar descriptions are applicable to other phases and, in particular, a Y-phase IGBT circuit and a Z-phase IGBT circuit, and descriptions thereof are omitted herein. In this case, parasitic resistances Rx1-Rx3 caused by the arrangement of power-supply lines and ground lines depicted in FIGS. 3A and 3B are different for each phase, and hence as depicted in FIG. 4, there will be differences (variations) between the output currents of the individual phases even when the same MOS (metal-oxide-semiconductor) size (e.g., gate width) is designed.

In the current mirror scheme depicted in FIGS. 3A and 3B, a current proportional to a current that flows through the drain of the PMOS transistor 54 (MN1) on the primary side connected to the operational amplifier (AMP1) flows, owing to a mirror effect, as a driving current from the drain of the PMOS transistor 55 (MP2) on the secondary side to the gate of the X-phase IGBT 57.

A current adjustment for the current mirror depends on the value of the resistor (R1) connected between the PGND and the source of the NMOS transistor (MN1) connected to the operational amplifier output.

In FIGS. 3A and 3B, in addition, the individual circuits of the three phases have the same voltage V1 input to the operational amplifier (AMP1) 51 indicated on the left sides of FIGS. 3A and 3B; however, the length of a wire extending from a circuit (not illustrated) included in the chip depicted in FIG. 1 that generates the driving voltage V1 to the circuit layout is different for each of the three phases, and hence a drop between the line of the PGND (power ground) from the circuit that generates the driving voltage V1 (not illustrated) and the power supply line is different for each of the circuit layouts of the three phases. Accordingly, due to the presence of different wire resistances, there are variations (differences) in magnitude between the output currents of the individual circuits of the three phases.

FIG. 4 illustrates an output current waveform for each phase (X, Y, Z) of a conventional three-phase single IC output driver and also indicates a relationship between a MOS size (e.g., gate width) and the magnitude of an output current for a MOS that receives an output of the driving part of each phase (X, Y, Z) depicted in FIG. 1. As indicated in FIG. 4, the magnitudes of the output currents of the individual phases (X, Y, Z) for a predetermined MOS size satisfy "X phase>Y phase>Z phase", i.e., the magnitudes of the output currents are inequal (different) between the X, Y, and Z phases.

Patent document 1 indicated below discloses a semiconductor apparatus wherein a gate voltage for allowing two transistors Q1 and Q2 connected in parallel to have an equal current drive capability is determined in a test, test-result data based on the test is stored in a memory, and a driving circuit applies, to the gates of the transistors Q1 and Q2, a voltage based on the test-result data read from the memory, thereby driving the transistors Q1 and Q2 in an alternating pattern using the applied gate voltages.

PRIOR ART DOCUMENT

Patent Document

Patent Document 1: Japanese Laid-open Patent Publication No. 2013-098243 (FIG. 7)

SUMMARY

An insulated-gate semiconductor device driving circuit in accordance with a first aspect of the present invention operates an insulated-gate semiconductor device by supplying a driving current to a gate of the insulated-gate semiconductor device, the insulated-gate semiconductor device driving circuit including:

first and second transistors forming a current mirror, the first and second transistors each having a source connected to a power supply line;

a constant-current circuit connected to a drain of the first transistor that serves as an input part of the current mirror, the constant-current circuit generating a constant current by applying a referential voltage to a reference-value adjustment resistor;

a resistance-value correction circuit that adjusts a resistance value of the reference-value adjustment resistor;

a constant-current generation part connecting a drain of the second transistor to the gate of the insulated-gate semiconductor device, the drain of the second resistor serving as an output part of the current mirror; and a discharge circuit that draws out a current that has been injected into the gate of the insulated-gate semiconductor device by inputting a driving signal to a gate of a third transistor, wherein the discharge circuit corrects the MOS size of the third transistor using a MOS-size correction circuit so as to adjust the amount of a current that flows from the gate of the insulated-gate semiconductor device via a drain and a source of the third transistor and then through a ground line.

The above-described insulated-gate semiconductor device driving circuit is characterized in that the resistance-value correction circuit includes a series circuit having a plurality of serially connected parallel circuits each including a MOS transistor and an adjustment resistor, and the reference-value adjustment resistor is a composite resistor of the series circuit, the composite resistor being provided by turning on or off the MOS transistors by inputting a signal output from a PROM to each of gates of the MOS transistors of the plurality of parallel circuits.

The above-described insulated-gate semiconductor device driving circuit is characterized in that the resistance-value correction circuit includes a parallel circuit having a plurality of parallelly connected series circuits each including a MOS transistor and an adjustment resistor, and the reference-value adjustment resistor is a composite resistor of the parallel circuit, the composite resistor being provided by turning on or off the MOS transistors by inputting a signal output from a PROM to each of gates of the MOS transistors of the plurality of series circuits.

An insulated-gate semiconductor device driving circuit in accordance with a second aspect of the present invention operates an insulated-gate semiconductor device by supplying a driving current to a gate of the insulated-gate semiconductor device, the insulated-gate semiconductor device driving circuit including:

first and second transistors forming a current mirror circuit, the first and second transistors each having a source connected to a power supply line;

a constant-current circuit connected to a drain of the first transistor that serves as an input part of the current mirror circuit, the constant-current circuit generating a constant current by applying a referential voltage to a reference resistor;

a referential-voltage adjustment circuit that adjusts the referential voltage;

a constant-current generation part connecting a drain of the second transistor to a gate of the insulated-gate semiconductor device, the drain of the second resistor serving as an output part of the current mirror; and a discharge circuit that draws out a current that has been injected into the gate of the insulated-gate semiconductor device by inputting a driving signal to a gate of a third transistor, wherein the referential-voltage adjustment circuit includes a D/A converter to which a signal output from a PROM is input, and the referential voltage is an output of the D/A converter, and the discharge circuit corrects the MOS size of the third transistor using a MOS-size correction circuit so as to adjust the amount of a current that flows via a drain and a source of the third transistor and then through a ground.

The insulated-gate semiconductor device driving circuit of the first or second aspect is characterized in that the third transistor includes a plurality of parallelly connected MOS transistors, the MOS-size correction circuit includes selection circuits each connected to a gate of each of the plurality of MOS transistors, and the selection circuits each select, in response to a signal output from an EPROM, the driving signal or a signal for turning off the MOS transistor and input the selected signal to the gate of each of the MOS transistors.

The insulated-gate semiconductor device driving circuit of the first or second aspect is characterized in that the second transistor is also provided with a MOS-size correction circuit.

The above-described insulated-gate semiconductor device driving circuit is characterized in that the MOS-size correction circuit provides the second transistor by parallelly connecting a plurality of MOS transistors selected in response to a signal output from a PROM.

The insulated-gate semiconductor device driving circuit of any of those described above includes a plurality of said constant-current generation parts and a plurality of said discharge circuits that are associated with a plurality of insulated-gate semiconductor devices, and the plurality of constant-current generation parts and the plurality of discharge circuits are connected to a common power supply line and a common ground line.

The insulated-gate semiconductor device driving circuit of any of those described above further includes a fourth transistor connected between the power supply line and a gate of the first and second transistors forming the current mirror circuit, and a switch circuit that inputs the driving signal to a gate of the fourth transistor via a level shift circuit.

The insulated-gate semiconductor device driving circuit of any of those described above is characterized in that the insulated-gate semiconductor device is an IGBT.

BRIEF DESCRIPTION OF DRAWINGS

FIG. 3A illustrates a driving operation performed by a high-side PMOS transistor of a driving part of a conventional insulated-gate semiconductor device driving circuit;

FIG. 5 illustrates the configuration of a driving part of an insulated-gate semiconductor device driving circuit in accordance with a first embodiment of the present invention;

FIG. 6 illustrates a configuration example 1 of a reference-resistance correction circuit depicted in FIG. 5;

FIG. 8 illustrates the configuration of a driving part of an insulated-gate semiconductor device driving circuit in accordance with a second embodiment of the present invention;

DESCRIPTION OF EMBODIMENTS

Figure 1:
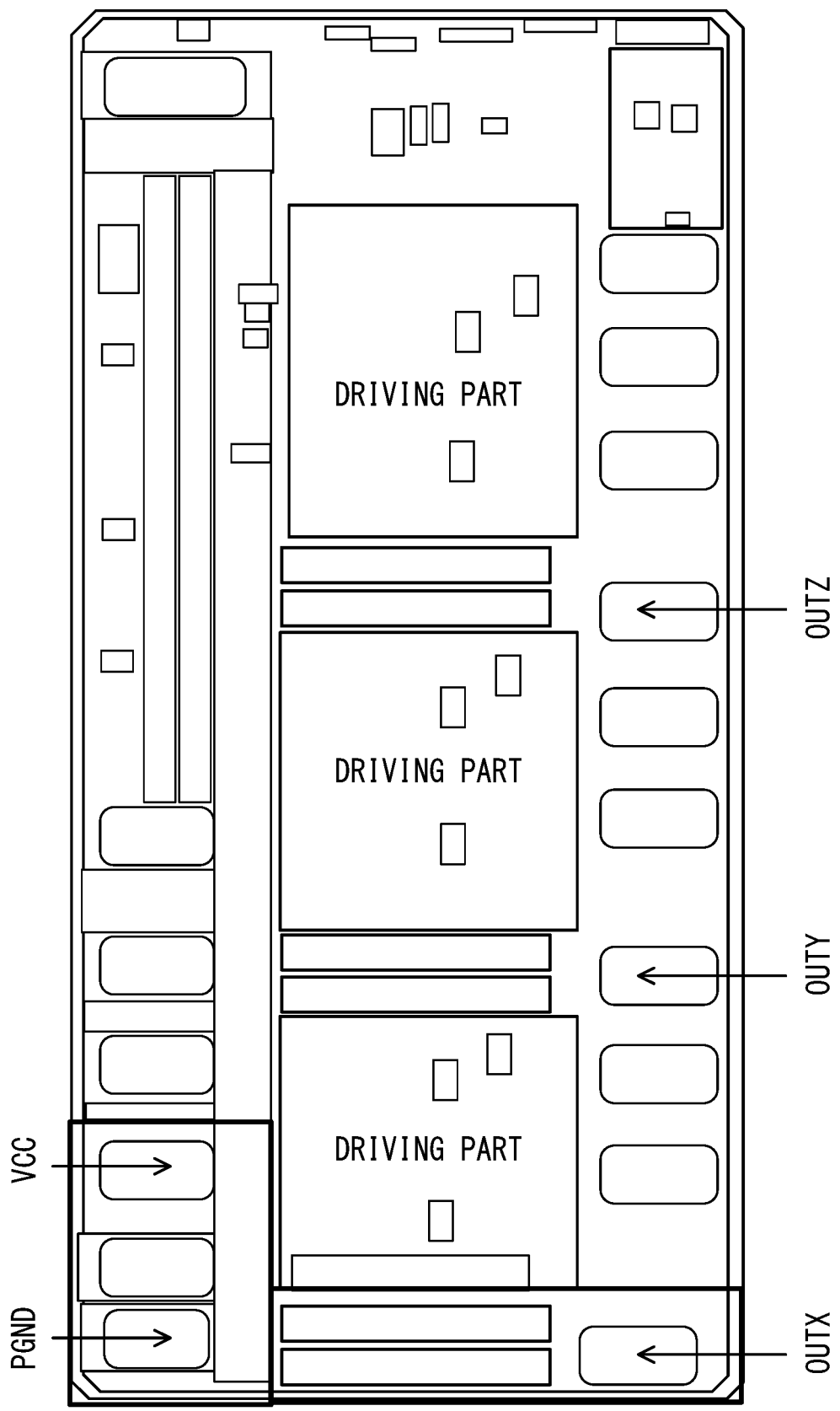
FIG. 1 illustrates the chip layout of a three-phase single IC output driver of a conventional insulated-gate semiconductor device driving circuit.
Figure 2:
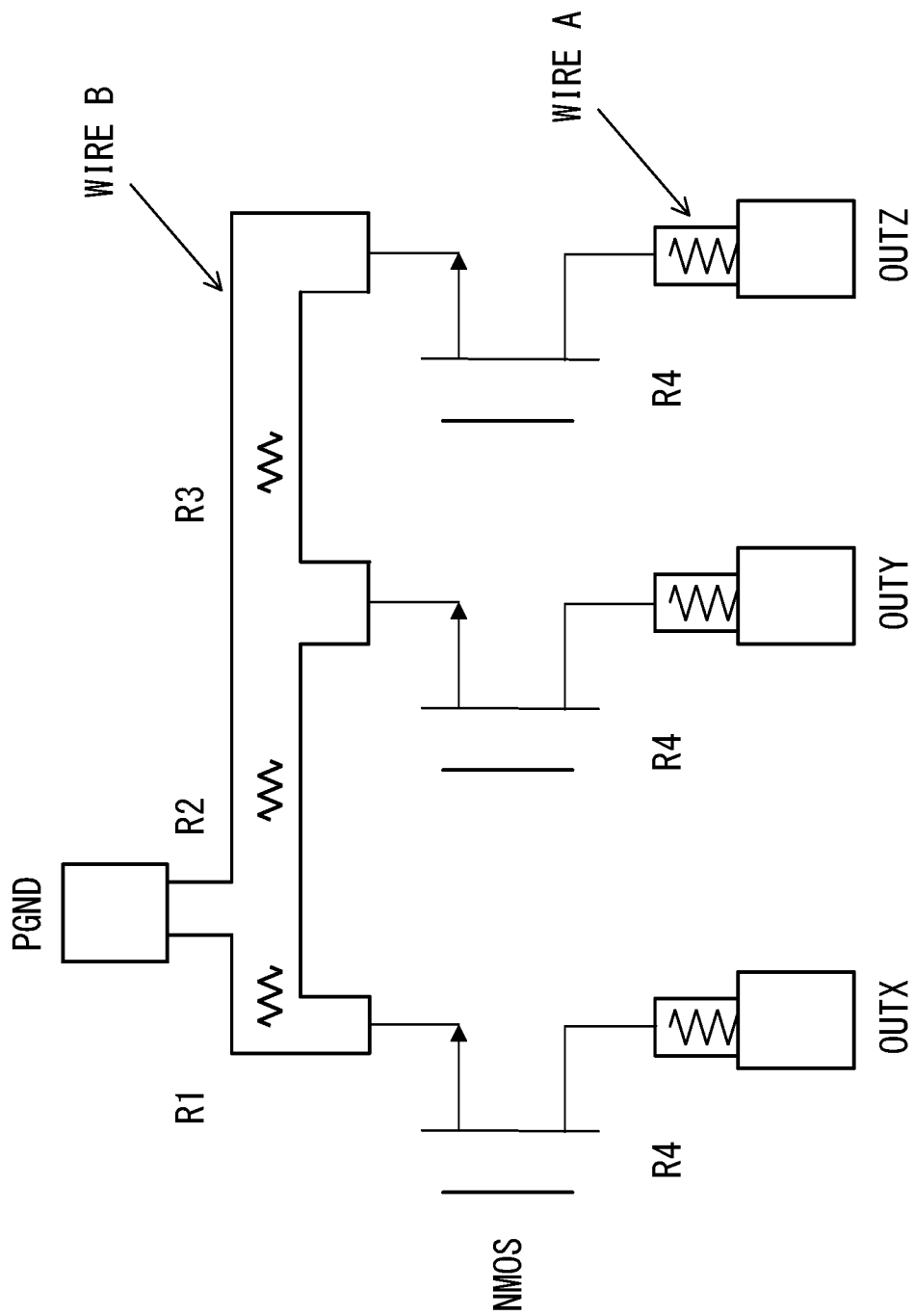
FIG. 2 represents wire resistances included in a three-phase single IC driver of a conventional insulated-gate semiconductor device driving circuit.
Figure 3B:
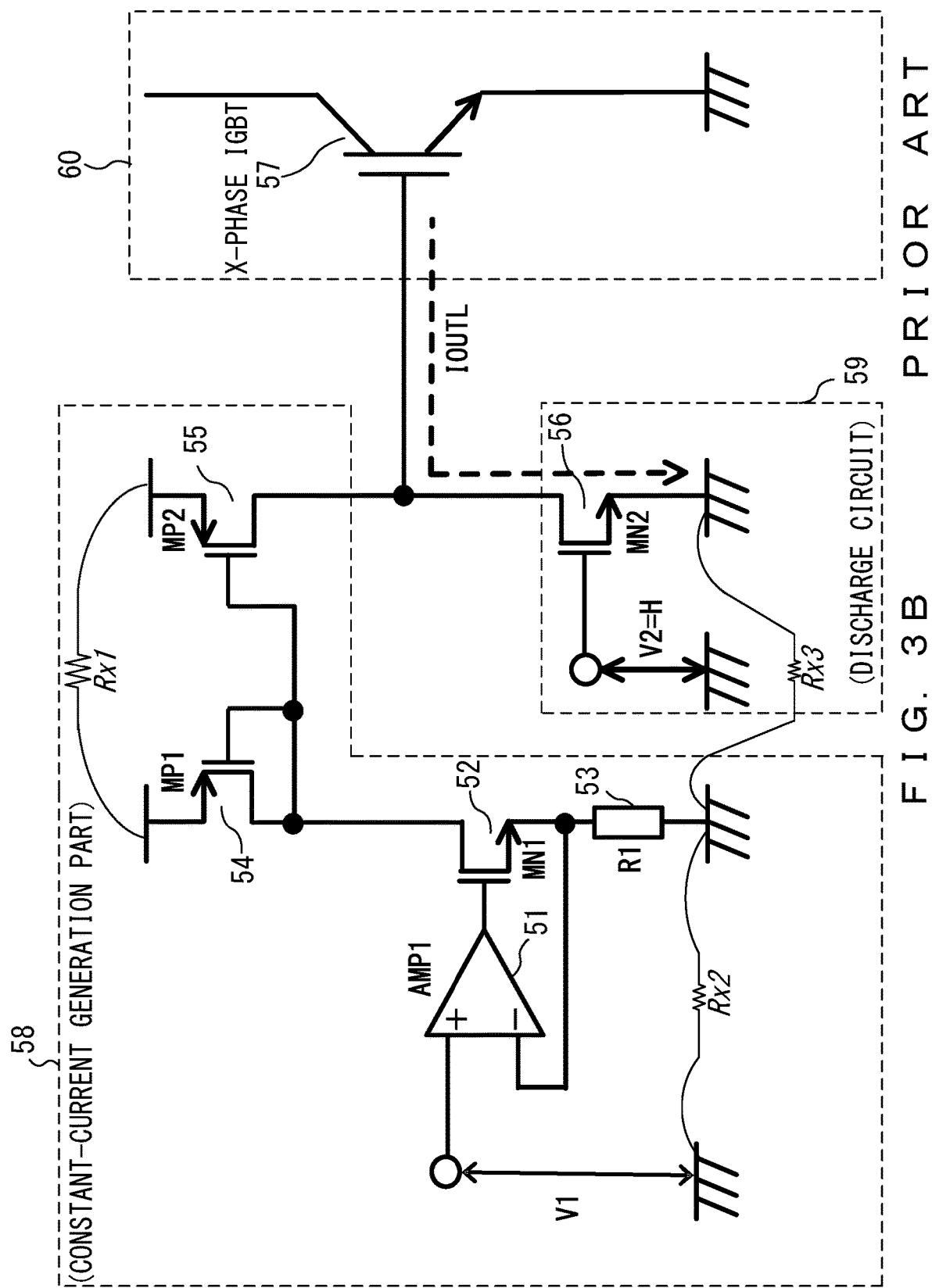
FIG. 3B illustrates a driving operation performed by a low-side NMOS transistor of the driving part depicted in FIG. 3A.

In the conventional circuit configuration examples depicted in FIGS. 3A and 3B, even if the circuit configurations of the driving circuits of individual phases are configured to achieve an equal performance, each of the three phases has, as indicated in FIG. 2, a different wire resistance on a path to a PGND, and hence there has been a problem of variations (differences) in magnitude between output currents.

The semiconductor apparatus described in document 1 is configured in a manner such that a driving circuit reads test-result data from a memory and applies a voltage based on the data directly to the gates of transistors Q1 and Q2 as a gate voltage (the current output from the driving circuit is immediately used as a gate voltage). Hence, when the transistors Q1 and Q2 receive a large current, there can be a problem of noise in a switching operation.

With the presence of the problem of noise, a circuit needs to be provided to charge or discharge a gate of a large-capacity transistor with a constant current. Hence, a charging current and a discharging current, not gate voltages, will need to be equal to solve the noise problem.

Accordingly, the present invention provides an insulated-gate semiconductor device driving circuit capable of adjusting, through PROM correction, variations in currents output to gates of a plurality of insulated-gate semiconductor devices.

The following describes embodiments of the invention in detail.

First Embodiment

FIG. 5 illustrates the configuration of a driving part of an insulated-gate semiconductor device driving circuit in accordance with a first embodiment of the present invention.

The insulated-gate semiconductor device driving circuit of the present embodiment supplies a charging or discharging current for driving a gate of an insulated-gate semiconductor device (e.g., insulated gate bipolar transistor (IGBT)) for each of three phases. FIG. 5 depicts the configuration of an insulated-gate semiconductor device driving circuit for one phase (e.g., X phase) that includes: a constant-current generation part 11, which is a constant-current generation circuit, that uses a current mirror scheme to drive an IGBT1; a discharge circuit 13 that draws out, in response to a driving signal, electric charges that have been injected into a gate of the IGBT1; and a switch circuit 12 that supplies a driving signal to the discharge circuit 13 via a buffer 6 and that inputs a driving signal to a gate of a PMOS transistor 3 via a level shift circuit 7 so as to switch between the charging and discharging of the gate of the insulated-gate semiconductor device.

In FIG. 5, the insulated-gate semiconductor device driving circuit includes a constant-current generation part 11 that uses a current mirror scheme to drive (charge), with a constant current, a gate of an IGBT1, i.e., an insulated-gate semiconductor device driving circuit for, for example, an X phase.

The constant-current generation part 11 includes two P-channel field effect transistors (PMOSs) 2 and 4 for forming a current mirror.

Sources of the PMOS transistors 2 and 4 are connected to a power supply line connected to a power supply voltage Vcc. A drain of the PMOS transistor 4 is connected to a drain of a NMOS transistor 8.

Gates of the PMOS transistors 4 and 2 are connected to the drain of the PMOS transistor 4.

The source of the PMOS transistor 3 is connected to the power supply line connected to the power supply voltage Vcc, and the drain of the PMOS transistor 3 is connected to the gates of the PMOS transistors 2 and 4. The gate of the PMOS transistor 3 is also connected to an output of the level shift circuit 7. A driving signal is input to the input of the level shift circuit 7 and the buffer 6.

The level shift circuit 7 is used to adjust a voltage input to the gate of the PMOS transistor 3. An output of the buffer 6 is input to the gate of a MOS transistor 5 provided within the discharge circuit 13. Turning on the NMOS transistor 5 connects the gate of the IGBT1 to a ground line (GND) connected to a pad of a PGND (power ground).

The drain of the PMOS transistor 4 is connected to the drain of the NMOS transistor 8. The gate of the NMOS transistor 8 is connected to an output of an operational amplifier 9. A referential voltage VREF defined within the driving circuit is input to a non-inverting input of the operational amplifier 9. An inverting input of the operational amplifier 9 is connected to the source of the NMOS transistor 8.

The source of the NMOS transistor 8 is connected to one end of a reference-value adjustment resistor Rref (10), and another end of the reference-value adjustment resistor Rref (10) is connected to the ground line (GND).

The two inputs of the operational amplifier 9 are virtually short-circuited, and the potential of one end of the reference-value adjustment resistor Rref (10) is thus the reference voltage VREF. Accordingly, a current that depends on a difference in potential between the referential voltage VREF and the ground line flows through the reference-value adjustment resistor Rref (10). This current flows through the drain of the PMOS transistor 4, i.e., an input part of the current mirror.

Figure 7:
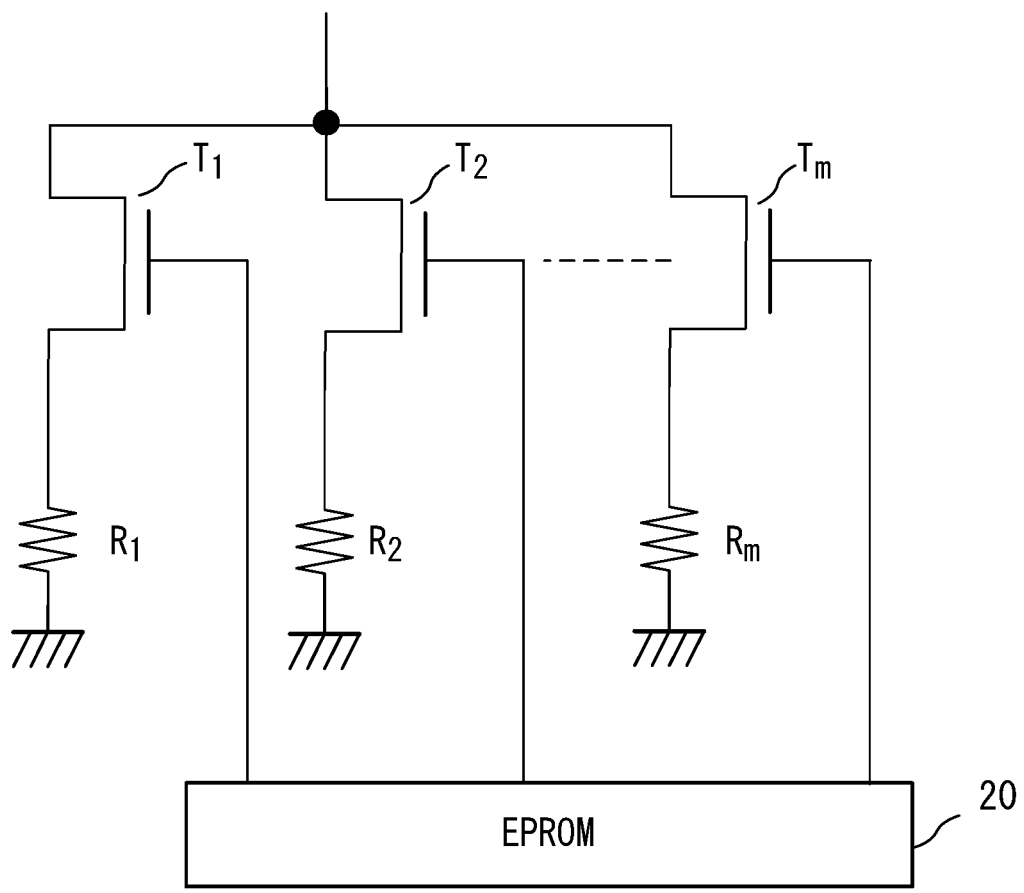
FIG. 7 illustrates a configuration example 2 of a reference-resistance correction circuit depicted in FIG. 5.

The reference-value adjustment resistor Rref (10) described above is achieved by, for example, the reference-resistance correction circuit depicted in FIG. 6 or 7. This will be described hereinafter.

In the configuration described above, when a predetermined constant current I0 flows through the drain of the PMOS transistor 4, i.e., an input part of the current mirror, while a voltage input to the gate of the NMOS transistor 5 provided at the discharge circuit 13 is at low level L, the PMOS transistor 3 is turned off. Accordingly, a current (OUT) proportional to the constant current I0 flows from the drain of the PMOS transistor 2, i.e., an output part of the current mirror, to the gate of the X-phase IGBT1 and is then injected into the gate of the X-phase IGBT1. The gate voltage of the charged IGBT1 exceeds a threshold, and hence the X-phase IGBT1 is turned on.

When a voltage input to the gate of the NMOS transistor 5 provided at the discharge circuit 13 is at high level H, the NMOS transistor 5 within the discharge circuit 13 is brought into conduction, and the above-described current injected into the gate so as to drive the IGBT1 starts to flow in an opposite direction, i.e., the current is drawn from the gate of the IGBT1 to the ground line (GND). The bringing of the PMOS transistor 3 into conduction results in a voltage of zero between the gate of the PMOS transistor 2 and the source of the PMOS transistor 4. Hence, no currents are output from the current mirror.

The X-phase IGBT1 is turned on or off by repeating the above-described operation with predetermined timing.

FIG. 6 illustrates a configuration example 1 of the reference-resistance correction circuit 100 depicted in FIG. 5. In FIG. 6, a reference-value adjustment resistor Rref (10) inputs an output obtained from an erasable programmable read only memory (EPROM) 20 to gates of MOS transistors $T_1$-$T_m$ so as to turn on or off the MOS transistors $T_1$-$T_m$. As a result, the activating/deactivating of adjustment resistors $R_1$-$R_m$ each connected between the source and drain of each of the MOS transistors $T_1$-$T_m$ is adjusted to achieve a reference resistance of an ideal value. In particular, turning on a transistor Ti (i=1 tom) short-circuits the ends of a corresponding adjustment resistor Ri, thereby inactivating the adjustment resistor Ri, and turning off the transistor Ti disconnects the ends of the adjustment resistor Ri, thereby activating the adjustment resistor Ri.

FIG. 7 illustrates a configuration example 2 of the reference-resistance correction circuit 100 depicted in FIG. 5. In FIG. 7, the reference-value adjustment resistor Rref (10) inputs an output obtained from the EPROM 20 to gates of MOS transistors $T_1$-$T_m$ so as to turn on or off the MOS transistors $T_1$-$T_m$. As a result, the activating/deactivating of adjustment resistors $R_1$-$R_m$ each connected between the source of each of the MOS transistors $T_1$-$T_m$ and the ground line (GND) is adjusted to achieve a reference resistance of an ideal value. Accordingly, turning off a transistor Ti (i=1 to m) disconnects and thus inactivates a corresponding adjustment resistor Ri, and turning on the transistor Ti connects and thus activates the adjustment resistor Ri.

Data stored in the EPROM depends on a current measurement in an element measurement (wafer measurement). For example, before writing to the EPROM, a current value may be identified in a test by successively selecting transistors Ti (i=1 to m) by using, instead of the EPROM, a shift register (not illustrated) that determines an ON/OFF state of the transistors Ti, and the content of the shift register may be written to the EPROM when the current value is closest to a designed value.

In the descriptions above, when the current on the primary side of the constant-current generation part 11 has become an ideal value, the current on the primary side of the current mirror in FIG. 5 becomes constant. The constant current, Io, can be determined according to the following formula (1), where Io indicates the constant current, and Rref indicates the reference-value adjustment resistance that has become an ideal value through EPROM correction.

$$Io = VREF/Rref \qquad (1)$$

Figure 9:
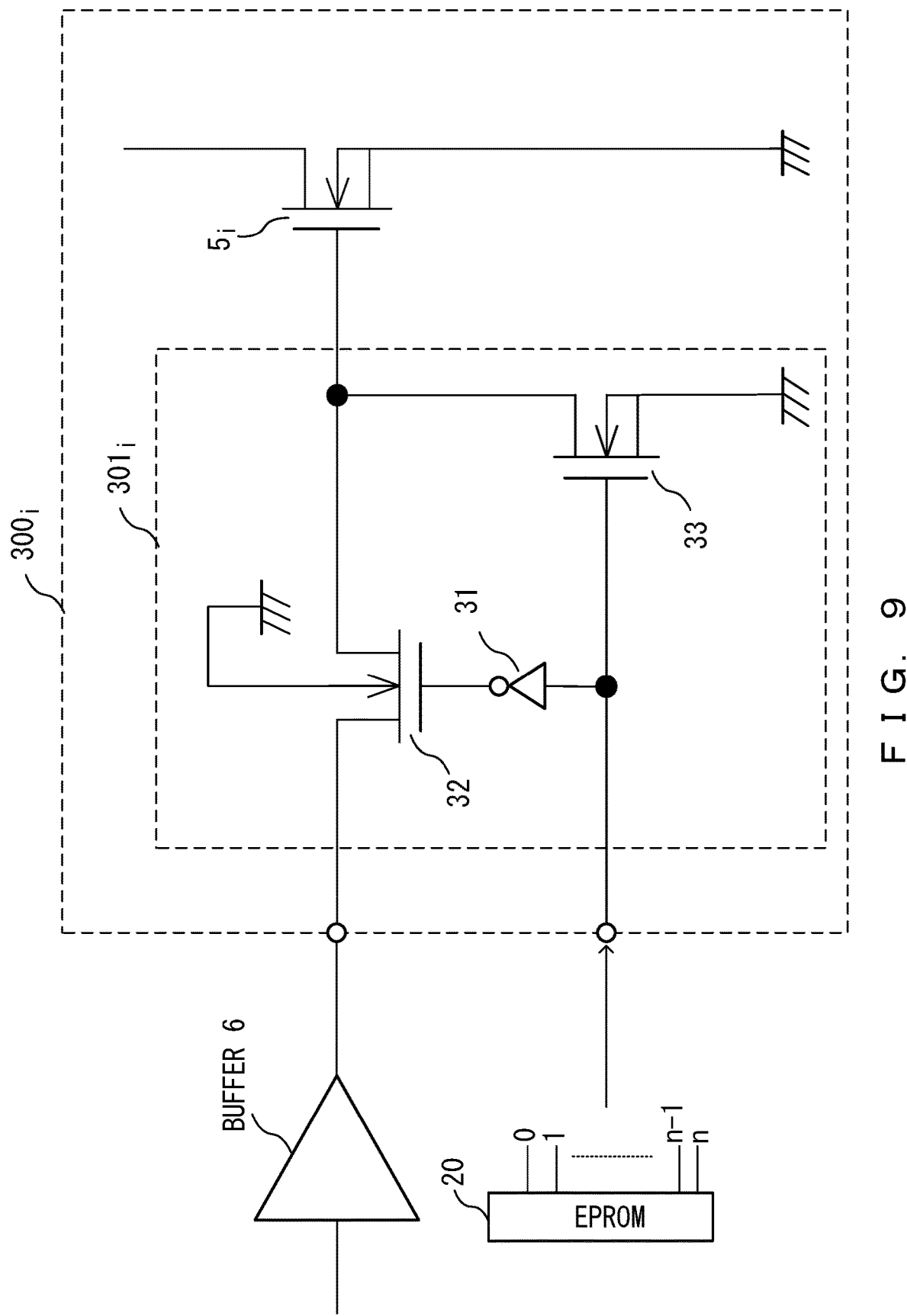
FIG. 9 illustrates an example of the configuration of a MOS-size correction circuit provided at an insulated-gate semiconductor device driving circuit in accordance with first and second embodiments of the present invention.

Next, a MOS-size correction circuit 300 depicted in FIG. 9 performs current-value correction for a current injected into the gate of the NMOS transistor 5 provided within the discharge circuit 13, i.e., a current that is to be drawn out through the drain and source of the NMOS transistor 5. This will be described herein after a second embodiment of the invention is described.

As described above, the insulated-gate semiconductor device driving circuit in accordance with the first embodiment of the invention performs, for each of the plurality of phases, EPROM correction of a reference resistor connected to the drain of the NMOS transistor, so as to determine a constant current to be input to the current mirror formed by the PMOS transistors provided on the high side. In addition, EPROM correction of the MOS size (e.g., gate width) of the low-side NMOS transistor can be performed to equalize the characteristics of output currents of the plurality of phases in spite of the presence of wire resistances resulting from configuration constrains of a power module product.

Second Embodiment

FIG. 8 illustrates the configuration of a driving part of an insulated-gate semiconductor device driving circuit in accordance with a second embodiment of the present invention.

As with the driving part of the insulated-gate semiconductor device driving circuit in accordance with the first embodiment of the invention depicted in FIG. 5, the driving part of an insulated-gate semiconductor device driving circuit in accordance with the second embodiment of the invention supplies a charging or discharging current to drive a gate of an insulated-gate semiconductor device (e.g., IGBT) of each of the three phases. FIG. 8 depicts the configuration of the driving circuit of an insulated-gate semiconductor device driving circuit for one phase (e.g., X phase), the driving part including: a constant-current generation part 18 that uses a current mirror scheme to drive an IGBT1; a discharge circuit 13 that draws out, in response to a driving signal, electric charges that have been injected into a gate of the IGBT1; and a switch circuit 12 that supplies a driving signal to the discharge circuit 13 via a buffer 6 and that inputs a driving signal to a gate of a PMOS transistor 3 via a level shift circuit 7 so as to switch between the charging and discharging of the gate of the insulated-gate semiconductor device.

In FIG. 8, a drain of a PMOS transistor 4 is connected to a drain of a NMOS transistor 8, and a gate of the NMOS transistor 8 is connected to an output of an operational amplifier 9. Unlike in the configuration depicted in FIG. 5, a referential-voltage adjustment circuit 200 for which an EPROM makes an adjustment to achieve an ideal referential voltage VREF is provided at a non-inverting input of the operational amplifier 9, and a referential voltage VREF adjusted by the adjustment circuit 200 is input to the non-inverting input. This will be described hereinafter. Meanwhile, an inverting input of the operational amplifier 9 is connected to a source of the NMOS transistor 8.

Unlike in the configuration depicted in FIG. 5, the source of the NMOS transistor 8 is connected to one end of a reference resistor Rref (15) having a preset value, and another end of the reference resistor Rref (15) is connected to a ground line (GND).

The configuration of the referential-voltage adjustment circuit 200 described above is achieved using an EPROM correction technique. In particular, the referential-voltage adjustment circuit 200 includes a D/A converter 201 and an EPROM 202, wherein the D/A converter 201 converts a value output from the EPROM 202 into an analog voltage value and inputs the converted value to the non-inverting input of the operational amplifier 9 as a referential voltage. Data stored in the EPROM is, for example, test data provided when a current value is closest to a designed value, wherein using a shift register that substitutes for the EPROM in a test, the test data is determined by identifying the value of a current that flows through a corresponding reference resistor Rref (15) in response to test data being input from outside to the D/A converter 201.

Current-value correction for a current is performed by adjusting the MOS size of the NMOS transistor 5, wherein the current-value correction is a process in which a charging current injected into the gate of the IGBT1 is drawn out through the drain and source of the NMOS transistor 5 provided within the discharge circuit 13. The adjustment of the MOS size, which is also made in the first embodiment, will be described hereinafter by referring to the MOS-size correction circuit 300 depicted in FIG. 9.

The MOS-size correction circuit 300 includes (n+1) MOS selection circuits 300$i$ connected in parallel, wherein the MOS selection circuits 300$i$ each include a selection circuit 301$i$ (i=0 to n) and a NMOS transistor 5$i$. FIG. 9 depicts the configuration of a MOS selection circuit 300$i$.

In FIG. 9, in accordance with a value input from the EPROM 20, the selection circuit 301$i$ selects, as a signal to be supplied to a gate of the NMOS transistor 5$i$, a driving signal obtained via a buffer 6 or a ground potential for turning off the NMOS transistor 5$i$. In particular, when an input signal obtained from the EPROM 20 is at high level H, an output of an inverter (INV) 31 is at low level L, and a NMOS transistor 32 is interrupted with a NMOS transistor 33 brought into conduction. Accordingly, the gate of the NMOS transistor 5$i$ is connected to the ground line (GND), and hence the NMOS transistor 5$i$ is turned off, with the result that a drawn-out current that would flow through the drain of the NMOS transistor 5$i$ and the ground line (GND) is interrupted.

When an input signal obtained from the EPROM 20 is at low level L, the output of the inverter (INV) 31 is at high level H, and an output of the buffer 6 passes through the NMOS transistor 32 with the NMOS transistor 33 turned off. Accordingly, the output of the buffer 6 is input to the gate of the NMOS transistor 5$i$, and the NMOS transistor 5$i$ is turned on or off by a driving signal.

As described above, (n+1) NMOS transistors 5$i$ are successively selected using data stored in the EPROM 20. Accordingly, the overall MOS size (e.g., gate width) is corrected to provide a drawn-out current value that is approximately ideal.

Data stored in the EPROM 20 is obtained by measuring a charging current drawn out of the gate of IGBT1 in a test. In particular, in a current measurement based on a wafer test for the NMOS transistor 5$i$ depicted in FIG. 9, for example, before writing to the EPROM, a current value may be identified by successively selecting (n+1) NMOS transistors by using, instead of the EPROM, a shift register (not illustrated) that determines an ON/OFF state of the transistors Ti, and the total information in the shift register may be written to the EPROM when the current value is closest to a designed value.

An example of a total gate width provided by the MOS-size correction circuit 300 can be expressed by a formula. The gate width of the NMOS transistor 5$i$ can be expressed by the following formula, where $W_i$ indicates the gate width of the transistor 5$i$, and $W_0$ indicates the gate width of the transistor $5_{(i=0)}$:

$$W_i = W_0 \times 2^i \ (i=1 \ \text{to} \ n) \tag{2}$$

Gate width $W_{total}$, which indicates the total gate width of n+1 transistors connected in parallel, can be determined by the following formula, where Pi indicates a signal supplied from the EPROM 20 to the transistor 5i, and P*i indicates a signal that is an inversion of the signal supplied from the EPROM 20:

$$W_{total} = \frac{((P^*_0)) + (P^*_1) \times 2 + (P^*_2) \times 2^2 + \ldots + (P^*_n) \times 2^n)}{W_0} \quad (3)$$

With reference to FIG. 8, an accuracy in a copy of a current mirror current output by the PMOS transistor 2, from among the two P-channel field effect transistors (PMOSs) 2 and that form a current mirror (i.e., components of the constant-current generation part 18), is considered to be decreased.

In this case, the PMOS transistor 2 is provided with a MOS-size correction circuit 300' (MOS selection circuit 300i') similar to that depicted in FIG. 9.

The configuration of the MOS-size correction circuit 300' including the PMOS transistor 2 is the same as that depicted in FIG. 9 except for the fact that the logic levels of signals from the EPROM 20 are recovered in accordance with the replacement of the transistors of the MOS selection circuit 300i depicted in FIG. 9 with PMOS transistors, the MOS-size correction circuit 300' including the PMOS transistor 2. Accordingly, descriptions of the configuration of the MOS-size correction circuit 300' are omitted herein.

Currents are corrected by the MOS-size correction circuit 300' so as to achieve an accurate mirror effect current with an accuracy that is close to a designed value. Accordingly, as in the configuration depicted in FIG. 9, a plurality of parallelly connected MOS selection circuits 300 and an EPROM are provided.

Regarding data stored in the EPROM, before writing to the EPROM, current values are identified by successively selecting parallelly connected PMOS transistors by, for example, using, in a test, a shift register (not illustrated) provided within an element that substitutes for the EPROM, and the content of the shift register is written to the EPROM when the current value is closest to a designed value.

As described above, the insulated-gate semiconductor device driving circuit in accordance with the second embodiment of the present invention performs EPROM correction of a referential voltage of an operational amplifier provided on the high side for a plurality of phases and further performs EPROM correction of a MOS size (e.g., gate width) for the NMOS transistor on the low side and/or the PMOS transistor on the high side. Accordingly, the characteristics of output currents of the plurality of phases can be equalized in spite of the presence of wire resistances resulting from configuration constrains of a power module product.

Figure 4:
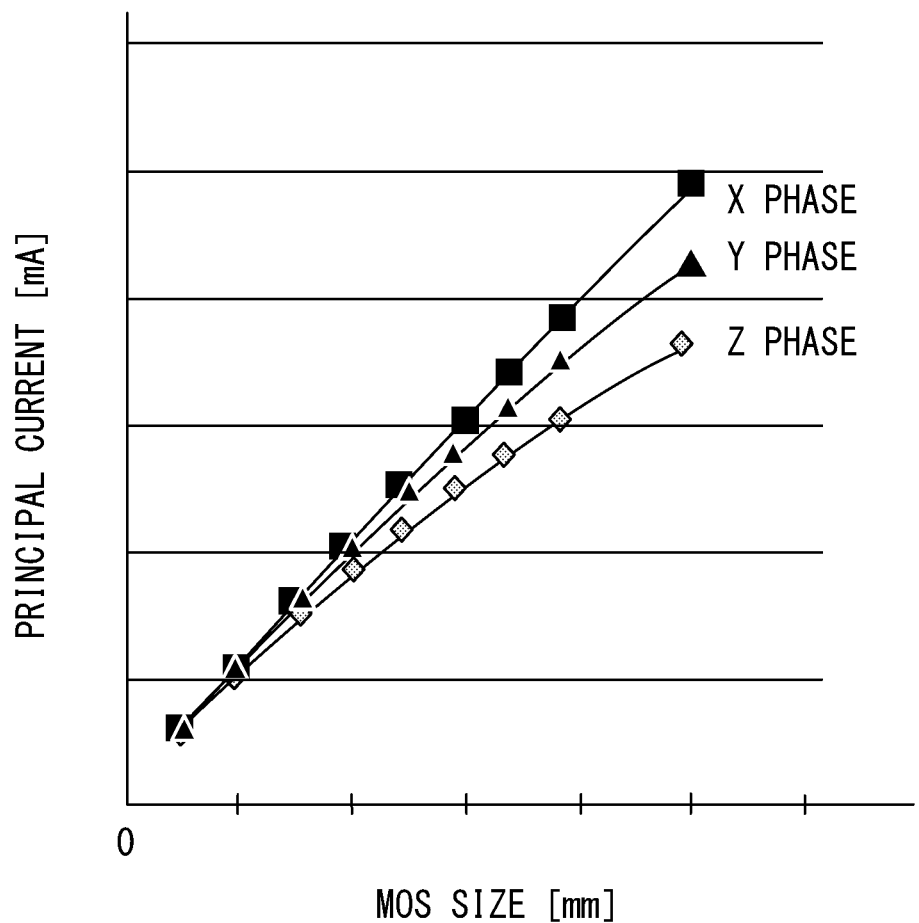
FIG. 4 illustrates output current characteristics of a conventional insulated-gate semiconductor device driving circuit.
Figure 10:
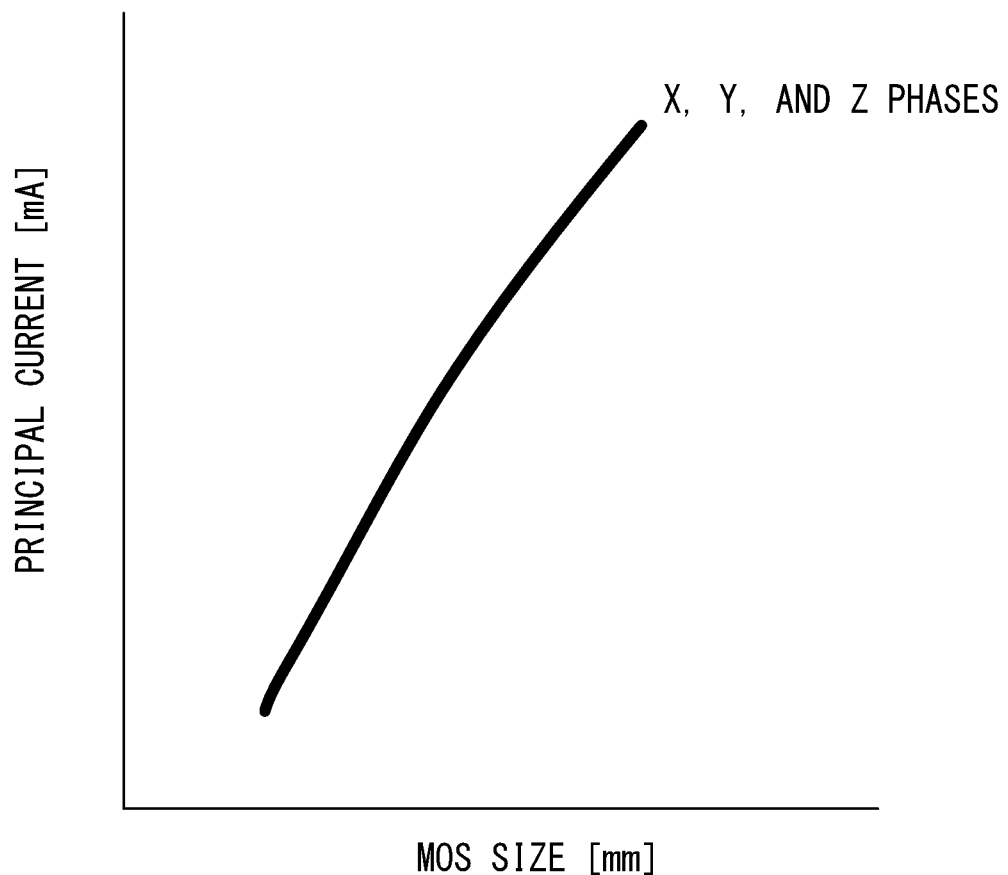
FIG. 10 illustrates output current characteristics of an insulated-gate semiconductor device driving circuit in accordance with embodiments of the present invention.

Performing EPROM correction for the insulated-gate semiconductor device driving circuit in accordance with the first or second embodiment of the present invention could result in the characteristics between the output current values of the X, Y, and Z phases which are equalized as depicted in FIG. 10, in accordance with the present embodiment, compared to the conventional characteristics between the output current values of X, Y, and Z phases which are different as depicted in FIG. 4.

As described above, the characteristics of output current values of the X, Y, and Z phases are equalized. Accordingly, output currents of a plurality of phases (e.g., three phases) can be made equal in spite of the presence of wire resistances resulting from configuration constraints of a power module product, thereby achieving stable switching characteristics.

The embodiments can be changed, deleted, or combined as appropriate without departing from the spirit of the invention.

The memories described above as EPROMs do not necessarily need to be erasable memories. For example, such memories may be simple programmable read only memories (PROMs).

What is claimed is:

1. An insulated-gate semiconductor device driving circuit that operates an insulated-gate semiconductor device by supplying a driving current to a gate of the insulated-gate semiconductor device, the insulated-gate semiconductor device driving circuit comprising:
   a constant-current generation circuit, including
      a first transistor and a second transistor forming a current mirror, a drain of the first transistor serving as an input of the current mirror, a drain of the second transistor serving as an output of the current mirror and being connected to the gate of the insulated-gate semiconductor device, the first and second transistors each having a source connected to a power supply line, and
      a constant-current circuit connected to the drain of the first transistor for providing a constant current to the current mirror, the constant-current circuit including
         a reference-value adjustment resistor to which a referential voltage is applied, and
         a reference-resistance correction circuit that adjusts a resistance value of the reference-value adjustment resistor; and
   a discharge circuit connected to the gate of the insulated-gate semiconductor device and the drain of the second transistor, the discharge circuit including a third transistor that has a gate, a drain and a source, and being configured to
      draw out a current injected into the gate of the insulated-gate semiconductor device by inputting a driving signal to the gate of the third transistor, and
      correct a metal-oxide-semiconductor (MOS) size of the third transistor so as to adjust an amount of a current that flows from the gate of the insulated-gate semiconductor device via the drain and the source of the third transistor to ground,
   wherein
      the third transistor includes a plurality of parallelly connected MOS transistors,
      the discharge circuit further includes a plurality of selection circuits that respectively correspond to the plurality of MOS transistors, wherein
         each selection circuit is connected to a gate of the corresponding MOS transistor,
         each selection circuit selects, in response to a signal output from an erasable programmable read only memory (EPROM), one of the driving signal and a signal for turning off the corresponding MOS transistor, and inputs the selected signal to the gate of the corresponding MOS transistor, and
         each selection circuit includes a fourth transistor, an inverter, and a fifth transistor, the fourth transistor including
            a source to receive the driving signal,
            a gate connected to an output of the inverter, and
            a drain connected to the gate of the corresponding MOS transistor, the fifth transistor including a source connected to the drain of the fourth transistor and the gate of the corresponding MOS transistor,
a gate connected to the EPROM and an input of the inverter, and
a drain connected to ground.

2. The insulated-gate semiconductor device driving circuit of claim 1, wherein
the reference-resistance correction circuit includes a plurality of serially connected parallel circuits, each of the parallel circuits including a MOS transistor and an adjustment resistor that are connected in parallel; and
the reference-resistance correction circuit is configured to input a signal from a programmable read only memory (PROM) to a gate of each of the MOS transistors of the plurality of parallel circuits, to thereby turn on or off the MOS transistors, an overall resistance value provided by the adjustment resistors being the resistance value of the reference-value adjustment resistor.

3. The insulated-gate semiconductor device driving circuit of claim 2, further comprising:
a sixth transistor connected between the power supply line and gates of the first and second transistors forming the current mirror, and
a switch circuit that inputs the driving signal to a gate of the sixth transistor via a level shift circuit.

4. The insulated-gate semiconductor device driving circuit of claim 2, wherein
the insulated-gate semiconductor device is an insulated gate bipolar transistors (IGBT).

5. The insulated-gate semiconductor device driving circuit of claim 1, wherein
the reference-resistance correction circuit includes a plurality of parallelly connected series circuits, each of the series circuits including a MOS transistor and an adjustment resistor that are connected in series; and
the reference-resistance correction circuit is configured to input a signal from a programmable read only memory (PROM) to a gate of each of the MOS transistors of the plurality of series circuits, to thereby turn on or off the MOS transistors, an overall resistance value provided by the adjustment resistors being the resistance value of the reference-value adjustment resistor.

6. The insulated-gate semiconductor device driving circuit of claim 5, further comprising:
a sixth transistor connected between the power supply line and gates of the first and second transistors forming the current mirror, and
a switch circuit that inputs the driving signal to a gate of the sixth transistor via a level shift circuit.

7. The insulated-gate semiconductor device driving circuit of claim 5, wherein
the insulated-gate semiconductor device is an insulated gate bipolar transistors (IGBT).

8. The insulated-gate semiconductor device driving circuit of claim 1, wherein
the second transistor is provided with a MOS-size correction circuit.

9. The insulated-gate semiconductor device driving circuit of claim 8, wherein
the MOS-size correction circuit provides the second transistor by parallelly connecting a plurality of MOS transistors selected in response to a signal from a programmable read only memory (PROM).

10. An insulated-gate semiconductor device driving circuitry, comprising:
a plurality of insulated-gate semiconductor device driving circuits that respectively operate a plurality of insulated-gate semiconductor devices, each insulated-gate semiconductor device driving circuit having a same structure as the insulated-gate semiconductor device driving circuit of claim 1, wherein
the plurality of constant-current generation circuits and the plurality of discharge circuits in the plurality of insulated-gate semiconductor device driving circuits are connected to a common power supply line and a common ground line.

11. The insulated-gate semiconductor device driving circuitry of claim 10, wherein in each of the insulated-gate semiconductor device driving circuits,
the reference-resistance correction circuit includes a plurality of serially connected parallel circuits, each of the parallel circuits including a MOS transistor and an adjustment resistor that are connected in parallel; and
the reference-resistance correction circuit is configured to input a signal from a programmable read only memory (PROM) to a gate of each of the MOS transistors of the plurality of parallel circuits, to thereby turn on or off the MOS transistors, an overall resistance value provided by the adjustment resistors being the resistance value of the reference-value adjustment resistor.

12. The insulated-gate semiconductor device driving circuit of claim 10, wherein in each of the insulated-gate semiconductor device driving circuits,
the reference-resistance correction circuit includes a plurality of parallelly connected series circuits, each of the series circuits including a MOS transistor and an adjustment resistor that are connected in series; and
the reference-resistance correction circuit is configured to input a signal from a programmable read only memory (PROM) to a gate of each of the MOS transistors of the plurality of series circuits, to thereby turn on or off the MOS transistors, an overall resistance value provided by the adjustment resistors being the resistance value of the reference-value adjustment resistor.

13. An insulated-gate semiconductor device driving circuit that operates an insulated-gate semiconductor device by supplying a driving current to a gate of the insulated-gate semiconductor device, the insulated-gate semiconductor device driving circuit comprising:
a constant-current generation circuit, including
a first transistor and a second transistor forming a current mirror, a drain of the first transistor serving as an input of the current mirror, a drain of the second transistor serving as an output of the current mirror and being connected to the gate of the insulated-gate semiconductor device, the first and second transistors each having a source connected to a power supply line, and
a constant-current circuit connected to the drain of the first transistor for providing a constant current to the current mirror, the constant-current circuit including
a reference resistor to which a referential voltage is applied, and
a reference-voltage adjustment circuit that adjusts the referential voltage, the referential-voltage adjustment circuit including a digital-to-analog (D/A) converter that receives a signal from a programmable read only memory (PROM) and outputs the referential voltage;
a discharge circuit connected to the gate of the insulated-gate semiconductor device and the drain of the second transistor, the discharge circuit including a third transistor that has a gate, a drain and a source, and being configured to
draw out a current injected into the gate of the insulated-gate semiconductor device by inputting a driving signal to the gate of the third transistor, and
correct a metal-oxide-semiconductor (MOS) size of the third transistor so as to adjust an amount of a current that flows via the drain and the source of the third transistor to ground,
wherein
the third transistor includes a plurality of parallelly connected MOS transistors,
the discharge circuit further includes a plurality of selection circuits that respectively correspond to the plurality of MOS transistors, wherein
each selection circuit is connected to a gate of the corresponding MOS transistor,
each selection circuit selects, in response to a signal output from an erasable programmable read only memory (EPROM), one of the driving signal and a signal for turning off the corresponding MOS transistor, and inputs the selected signal to the gate of the corresponding MOS transistor, and
each selection circuit includes a fourth transistor, an inverter, and a fifth transistor, the fourth transistor including
a source to receive the driving signal,
a gate connected to an output of the inverter, and
a drain connected to the gate of the corresponding MOS transistor, the fifth transistor including
a source connected to the drain of the fourth transistor and the gate of the corresponding MOS transistor,
a gate connected to the EPROM and an input of the inverter, and
a drain connected to ground.

14. The insulated-gate semiconductor device driving circuit of claim 13, wherein
the second transistor is provided with a MOS-size correction circuit.

15. The insulated-gate semiconductor device driving circuit of claim 14, wherein
the MOS-size correction circuit provides the second transistor by parallelly connecting a plurality of MOS transistors selected in response to a signal from a programmable read only memory (PROM).

16. The insulated-gate semiconductor device driving circuit of claim 13, further comprising:
a sixth transistor connected between the power supply line and gates of the first and second transistors forming the current mirror, and
a switch circuit that inputs the driving signal to a gate of the sixth transistor via a level shift circuit.

17. The insulated-gate semiconductor device driving circuit of claim 13, wherein
the insulated-gate semiconductor device is an insulated gate bipolar transistors (IGBT).

18. An insulated-gate semiconductor device driving circuitry, comprising:
a plurality of insulated-gate semiconductor device driving circuits that respectively operate a plurality of insulated-gate semiconductor devices, each insulated-gate semiconductor device driving circuit having a same structure as the insulated-gate semiconductor device driving circuit of claim 13, wherein
the plurality of constant-current generation circuits and the plurality of discharge circuits in the plurality of insulated-gate semiconductor device driving circuits are connected to a common power supply line and a common ground line.

* * * * *